(12) United States Patent
Sudjian et al.

(10) Patent No.: US 7,015,736 B1
(45) Date of Patent: Mar. 21, 2006

(54) SYMMETRIC CHARGE PUMP

(75) Inventors: Douglas Sudjian, Santa Clara, CA (US); David H. Shen, Saratoga, CA (US)

(73) Assignee: IRF Semiconductor, Inc., Cupertino, CA (US)

( * ) Notice: Subject to any disclaimer, the term of this patent is extended or adjusted under 35 U.S.C. 154(b) by 37 days.

(21) Appl. No.: 10/890,033

(22) Filed: Jul. 13, 2004

Related U.S. Application Data (60) Provisional application No. 60/487,614, filed on Jul. 17, 2003.

(51) Int. Cl.
*H03L 7/06* (2006.01)
(52) U.S. Cl. .................................. 327/157; 327/148
(58) Field of Classification Search ................ 327/148, 327/157, 362, 543; 323/315
See application file for complete search history.

(56) References Cited

U.S. PATENT DOCUMENTS

| | | | |
|---|---|---|---|
| 6,426,614 B1 * | 7/2002 | Guthrie | 323/315 |
| 6,636,105 B1 * | 10/2003 | Soda | 327/537 |
| 6,747,506 B1 * | 6/2004 | Thiara | 327/537 |
| 6,856,182 B1 * | 2/2005 | Moyal | 327/157 |
| 2002/0089382 A1 * | 7/2002 | Yang | 331/17 |

OTHER PUBLICATIONS

Chih-Ming Hung and Kenneth K.O., "A Fully Integrated 1.5V 5.5 GHz CMOS Phase-Locked Loop", IEEE Journal of Solid-State Circuits, vol. 37, No. 4, Apr. 2002.
William B. Wilson, Un-Ku Moon, Kadaba R. Lakshmikumar and Liang Dai, "A CMOS Self-Calibrating Frequency Synthesizer," IEEE Journal of Solid-State Circuits, vol. 35, No. 10, Oct., 2000.

* cited by examiner

*Primary Examiner*—Terry D. Cunningham
*Assistant Examiner*—Thomas J Hiltunen (57) ABSTRACT

A charge pump is disclosed which generates higher and more symmetric source and sink currents that prior designs and reduces the multiple frequency sidebands that occur in a voltage controlled oscillator of a phase-loop synthesizer. Other improvements are the reduction in reference frequency feed-through, charge sharing and noise transient coupling and phase noise in the phase-locked loop. Possible applications include but are not limited to charge pump phase-locked designs for single chip CMOS multi-band and multi-standard radio frequency integrated circuits.

18 Claims, 10 Drawing Sheets

SYMMETRIC CHARGE PUMP

THIS APPLICATION IS BASED ON THE PROVISIONAL APPLICATION No. 60/487,614 FILED ON Jul. 17, 2003.

REFERENCES

[1] Chih-Ming Hung and Kenneth K. O, "A Fully integrated 1.5 V 5.5 GHz CMOS Phase-Locked Loop", IEEE JSSC, Vol. 37, No. 4, April 2002.
[2] William Wilson, Un-Ku Moon, Kadaba R. Lakshmikumar and Liang Dai "A Self-Calibrating Frequency Synthesizer", IEEE JSSC, Vol. 35, No. 10, October 2000.

BACKGROUND—TECHNICAL FIELD OF INVENTION

The present invention relates to a high efficiency symmetric CMOS charge pump architecture and circuit design that can be used in phase-locked loop (PLL) frequency synthesizers. The PLL application examples include but are not limited to radio frequency receivers and transmitters for all wireless communication standards including cellular 2.5 G/3 G/4 G wireless communications, optical fiber communications, network communications and storage systems.

BACKGROUND OF THE INVENTION AND DISCUSSION OF PRIOR ART

The growing demand for wireless communications has motivated attempts to design radios that permit the integration of more components onto a single chip. The recent advances in CMOS semiconductor processing allow the integration of the radio receiver and transmitter into a single chip radio frequency (RF) transceiver to reduce cost, size and power consumption.

BACKGROUND OF THE INVENTION

Phase-locked Loop

Figure 1:
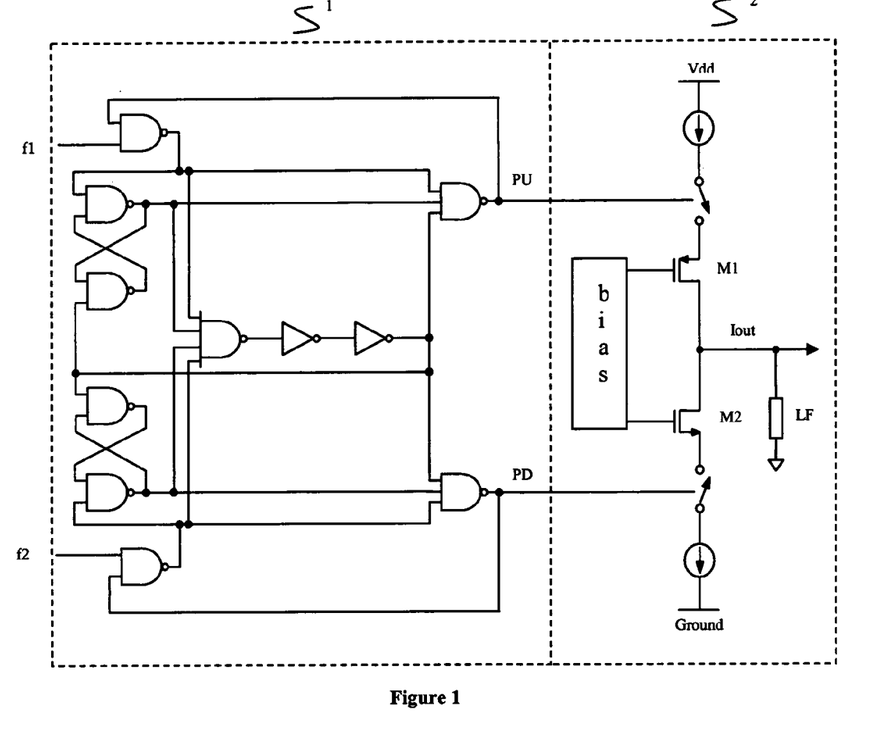
FIG. 1 is a schematic of a prior art PFD and charge pump combination circuit.
Figure 2:
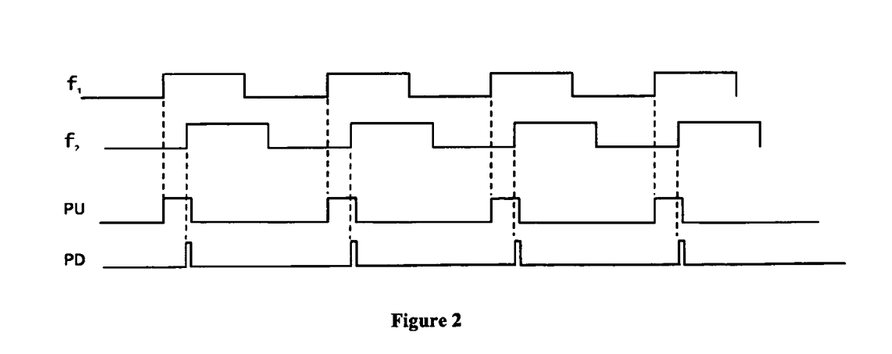
FIG. 2 is a timing diagram of a prior art PFD circuit.

Phase-locked loop (PLL) frequency synthesizer, one of the most important and challenging building blocks of the RF transceiver, is most suitable for low cost CMOS integration of wireless communication integrated circuits. PLL's are used but not limited in wireless receivers and transmitters in part for frequency synthesis where a synthesized local oscillator (LO) frequency is needed to mix down the Receive Signal Carrier such that the modulated signal is down-converted and the resulting base-band signal can be processed. Since the receive signal can operate in different bands or at discrete frequencies as part of the data transmission standard, an agile PLL frequency synthesizer is needed in order to track the receiver frequency by adjusting the LO frequency. A charge pump PLL is comprised of a reference oscillator (usually crystal based), a phase-frequency detector (PFD), charge pump (either voltage or current mode), a loop filter, a voltage-controlled oscillator (VCO), and a programmable feedback frequency divider. Each of the PLL building elements represents architecture and circuit design challenges. The generation of sideband levels in a PLL is a major concern that usually drives a charge pump's design and loop filtering requirements. In the most stringent GSM receiver area, the channel spacing (200 kHz) is considerably narrower than other wireless communication standards. When using an integer M/N PLL in a frequency synthesizer, the input reference frequency must be of the same order of magnitude relative to the channel spacing frequency specification. The PLL is able to synthesize frequencies with frequency steps equal to an integer multiple of the input reference frequencies. The maximum loop filter bandwidth is limited by the update rate of the PFD, which is the sample rate of the loop. As a rule of thumb, loop filter bandwidth should be much less than one tenth ($\frac{1}{10}$) of the PFD update rate to avoid instability of the PLL. If the sample rate of the input reference frequency and the PLL loop bandwidth becomes relatively close, then discrete time techniques may be needed or added to stabilize and predict PLL transient and steady state performance to avoid signal degradation. With the stringent loop filter bandwidth and reference frequency feed through filtering requirements, the charge pump PLL is a most suitable solution with the charge pump itself drawing considerable interest and study. The charge pump design works in conjunction with the PFD to improve the PLL performance. FIG. 1 show the combination of a PFD, 1, and a charge pump, 2. The PFD is a common Type Four, tri-state approach that can be implemented with various digital design methods. This design detects the phase and/or frequency difference between the reference signal, f1 and the divided VCO output signal f2 as shown in the timing diagram in FIG. 2. The resulting output signals, PU and PD, are used to control the relative current commutation times in the charge pump output current Iout. The charge pump output drives a passive loop-filter LF, which can include passive load elements of resistance, capacitance and inductance.

Charge Pump

Charge pumps as well as PLL frequency synthesizers are used in many computer, consumer and communication applications. Charge pumps can operate in either current or voltage mode and are implemented in different ways with fully differential or single-ended signal designs. Within these two classifications, there are multiple design options with their own inherent benefits and flaws.

The simplest charge pump design is the single-ended signal design where the charge pump is controlled by full swing digital signals to open a current source switch for a sourcing or sinking operation. In addition, the digital signal control will be used to quickly turn off the current source switch in the high impedance or tri-state mode. Rapid turn-on and turn-off times as well as the relative ease of matching the timing of the source and sink controlling signals are the benefits of this approach. However, relatively large transients can be induced across parasitic junction capacitance's that inject unwanted spurious noise. Furthermore, full swing designs always suffer from transient currents being induced through the power supply and ground return paths as well as introducing low efficiency in the charge pump because of asymmetrical current sourcing and current sinking behavior.

Differential signal charge pump designs using constant current mode operation have also been proposed for the charge pump to overcome the shortcomings of the single-ended design. The differential signal design approach has the benefits of high common-mode rejection to power supply noise and providing symmetrical pump currents. The differential approach while looking favorable in many areas has its own limitations such as constant power loss and charge injection from the charge pump into the loop filter load. In certain charge pump architectures, relatively small sized differential devices are used to steer the currents in order to reduce parasitic capacitance, charge injection and charge sharing effects. However, undesirably larger driving signals are still needed to completely steer current across the small sized differential pair devices. In this situation, larger driving signals again lead to the above mentioned effects of transients induced across parasitic junction capacitance's that inject unwanted spurious noise contributing to increased reference frequency feed-through in the PLL.

The Reference Frequency Feed-Through/Modulation Sideband Theory

Due to the fact that the VCO is typically controlled by a node voltage, any reference frequency feed-through effects from the phase detector/charge pump design can modulate this voltage thereby creating modulation sidebands at the VCO RF frequency. Shown below is a mathematical description of this modulation process where modulation tones are shown to be linear in power level for small modulation indexes.

$\omega_c$—Carrier frequency
$m_p$—modulation index
g(t)—modulation function (sinusoid)

1. $m(t) = A\cos(\omega_c t + \phi)$

2. $\phi = m_p * g(t)$

3. $g(t) = \cos\omega_n t$

4. $m(t) = A\cos(\omega_c t + m_p * \cos(\omega_m t))$

5. $\cos(\alpha + \beta) = \cos\alpha\cos\beta - \sin\alpha\sin\beta$

6. $m(t) =$
$$A\cos\omega_c t\cos(m_p * \cos(\omega_m t)) - A\sin\omega_c t\sin(m_p * \cos(\omega_m t))$$

7. $\cos(z\cos\Theta) = J_0(z) + 2\sum_{n=0}(-1)^n J_{2n}(z)\cos(2n\Theta)$

8. $\sin(z\cos\Theta) = 2\sum_{n=0}(-1)^n J_{2n+1}(z)\cos(2n+1)\Theta$

9. $m(t) = A\left\{\left(\cos(\omega_c t)J_0(m_p) + 2\sum_{n=1}(-1)^n J_2(m_p) * \cos\omega_c t\cos(2n\omega_m t) - 2\sum_{n=0}(-1)^n J_{2n+1}(m_p) * \sin\omega_c t\cos(2n+1)\omega_m t\right)\right\}$ 10. $\cos x \cos y = 1/2[\cos(x+y) + \cos(x-y)]$ 11. $\sin x \sin y = 1/2[\sin(x+y) + \sin(x-y)]$ 12. $m(t) = A\left\{\left(\cos(\omega_c t)J_0(m_p) + \sum_{n=1}(-1)^n J_{2n}(m_p)[\cos\omega_c t + 2n\omega_m t) + \cos(\omega_c t - 2n\omega_m t)] - \sum_{n=0}(-1)^n J_{2n+1}(m_p) * \sin\omega_c t + (2n+1)\omega_m t + \sin(\omega_c t - (2n+1)\omega_m t)\right)\right\}$ $m(t) = A\{J_0(m_p)\cos\omega_c t + J_1(m_p)[\sin(\omega_c + \omega_m)t + \sin(\omega_c - \omega_m)t] - J_2(m_p) \cdot [\cos(\omega_c t + 2\omega_m)t + \cos(\omega_c t - 2\omega_m)t] + J_3(m_p)[\sin(\omega_c t + 3\omega_m)t + \sin(\omega_c t - 3\omega_m)t] - \ldots \}$ The final expression shows that a carrier modulated by a single sinusoid produces sets of sidebands offset from the carrier by every possible multiple of the modulating frequency. The Bessel coefficients ($J_n$) are a function of the modulation index. If $m_p$ is small, the higher frequency sideband terms are not significant. Thus, for small modulation index only the first-order sidebands are significant. The resulting frequency spectrum will resemble a carrier undergoing amplitude modulation.

Discussion of Prior Art

New charge pump designs [1] are being proposed to improve the PLL performance by adding cascoded devices for faster turn-on and turn-off and for reducing charge sharing problems of operating the high and low side switch together. However, this type of design suffers from larger internal dynamic voltage swings that increase the reference frequency feed through from the switching elements to the filter load.

Figure 3:
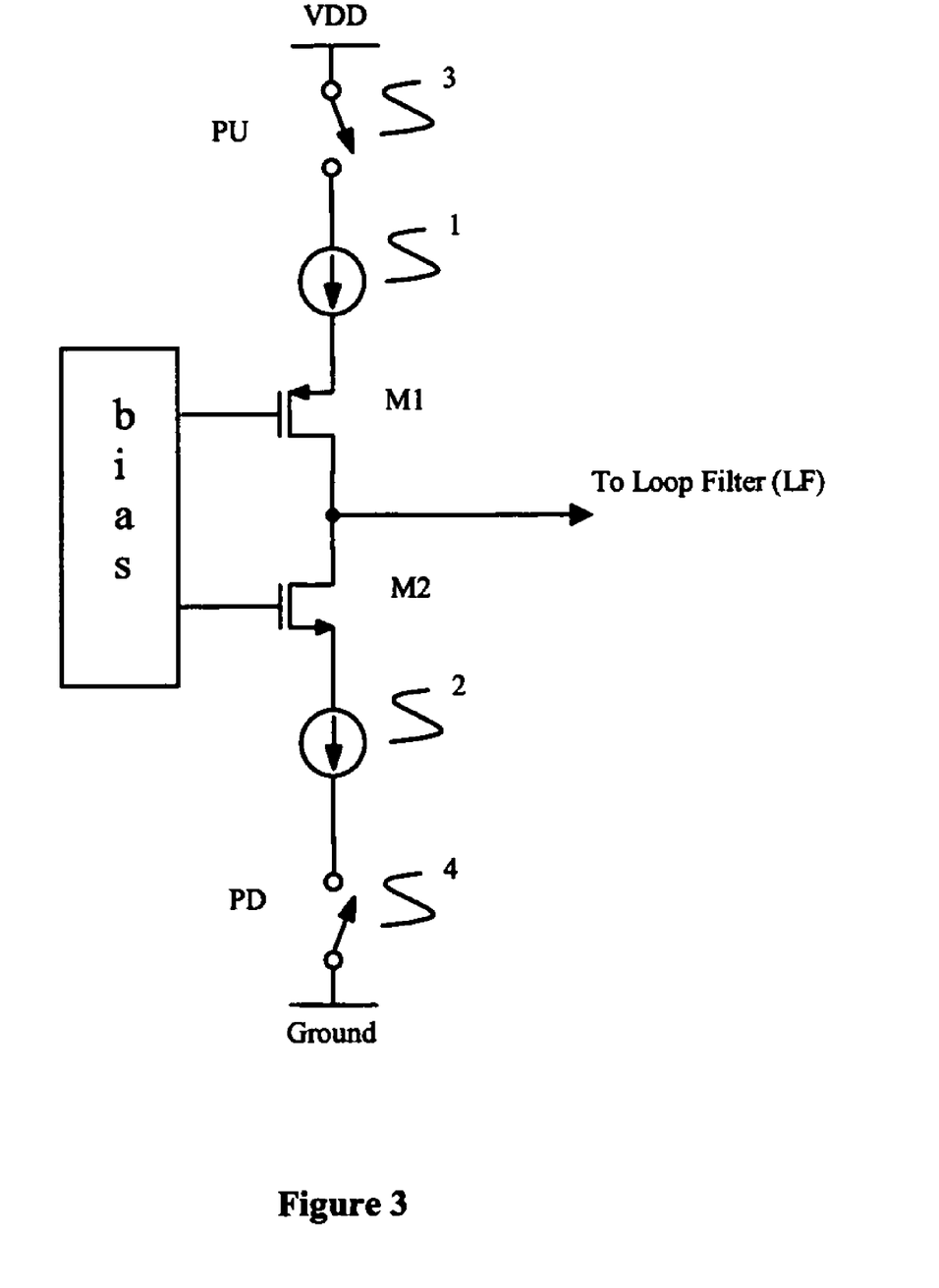
FIG. 3 is a schematic of a prior art charge pump.

FIG. 3 shows a charge pump design known as prior art [2] with the added cascode device M1 between the charge pump current source, 1 and the output node, Iout; and the added cascode device M2 between the charge pump current sink, 2 and output node, Iout. A bias voltage circuit is connected to the cascaded devices M1 and M2. The design improves the symmetry of both the turn-on and turn-off times by isolating the feed-through of the controlling signals, PU and PD that drive the switches, 3 and 4, from the charge pump output node, Iout. However, since the internal circuit nodes settle to their own internal turn-on and turn-off voltages, this leads to potentially long and asymmetric turn-off decays. In addition, switching transients are still not optimally reduced in these designs.

Objects and Advantages of the Invention

Accordingly, it is a primary object of the present invention to provide a new charge pump design for high performance CMOS Frequency Synthesizers. The application is intended for the very stringent design specifications of high integration RF receivers and/or transmitters requiring low cost, small size and low power. In a common architecture where a charge pump drives a passive filter load, the resulting voltage used to control a voltage-controlled oscillator (VCO) translates directly to the AC performance of the VCO and the overall PLL control loop system. Static phase detector offset, reference frequency feed-through, and high sideband levels are direct results of non-idealities in the charge pump design. Asymmetry in the charge pump drive such as non-ideal current transitions driving a passive loop filter contribute to transient spurs on the VCO control voltage node resulting in unwanted frequency side band spectra. These errors and effects due to the charge pump current switching inefficiencies' are greatly magnified in a frequency synthesizer architecture that uses a Sigma-Delta modulator (SDM). Reference spurs and other frequency spectra must be controlled in SDM designs for PLL implementations. Accurate charge pumps are required for GSM receiver synthesizers to meet the most rigid phase noise and frequency sideband specifications in wireless communications. The following lists the advantages of the invention compared to prior art charge pumps.

1. Reference frequency sidebands are minimized due to improved matching in the current source and current sink drivers compared to the prior art same type charge pump designs and compared to other types of charge pump designs.
2. Current sink and source driver symmetry and path matching properties remain the same over temperature and manufacturing process variations.
3. Double cascode design in both the source and sink driver eliminates or reduces the transient feed-through at turn-on and turn-off events.
4. The charge pump is scalable by adding multiple source and sink stages to achieve larger increase in charge pump current levels while the matching and symmetry properties of both the source and sink sections remain.

5. A passive replica bias clamp circuit detects and controls the leakage current in the charge pump off-state.

SUMMARY OF THE INVENTION

The present invention achieves the above objects and advantages by providing a new method for implementing a charge pump with double cascoded drivers, a reference signal generator and a replica bias clamp detection circuit. The following lists the new design features of the charge pump for this invention.

1. Double cascoded source and sink drivers designed to have very symmetrical turn-on and turn-off effects and high output impedance in the off-state.
2. Single or multiple reference voltage generators to balance the symmetry of the turn-on and turn-off currents over operating temperature.
3. Signal path matching is optimized with matched differential CMOS full swing control signals.
4. Transmission gates implemented for both current sink and current source to achieve low leakage current in the off-state and fast turn-on time in the on-state.
5. A replica bias clamp detection circuit which limits the reverse off-state leakage current in the charge pump.
6. Overall architecture enables independent symmetry and matching optimization of the turn-on and turn-off current transients in both the current source and current sink drivers/switches.

DESCRIPTION OF THE PREFERRED EMBODIMENT

Figure 4:
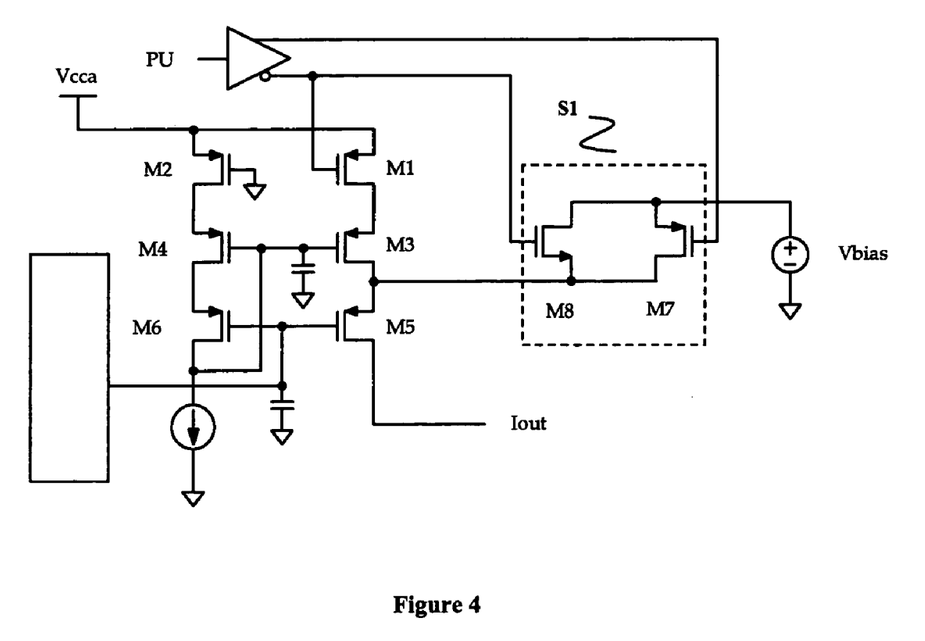
FIG. 4 is a schematic of a PMOS current source of a charge pump constructed with the principles of the invention.

FIG. 4 is a schematic of the top-side PMOS current source of a charge pump constructed in accordance with the principles of the present invention. The charge pump theory of operation is common between the top-side PMOS current source and bottom-side current sink circuits. Therefore the explanation on the PMOS top-side circuit is sufficient for the total charge pump section. This embodiment is for a new Charge Pump architecture and design for use in a PLL frequency synthesizer for radio frequency applications including but not limited GSM standard with a very symmetrical charge pump current drive. This novel architecture permits the symmetrical turn-on time, rise time and fall time to be independent in the design and optimization process. The generation of differential output phases for both pump-up, PU and pump-down, PD is synchronized by a PFD and charge pump driver and buffer. All current source and sink cells are identical and should track very well over manufacturing process and operating temperature variations. When the transmission switch, S1, consisted of M7 and M8 is open, M3 and M5 act as a cascode current mirror arrangement. M2 is always turned on and will operate in the triode region. M1 turns on when its gate is pulled low by the buffered pump up control signal, PU. M1 then pulls up the source of M3 towards the power supply, Vcca relative to M3's gate voltage. As M3 starts to turn on, M5's source voltage also rises higher than its gate voltage. The turn-on speed capability of this current path is limited by the charging capacitance at the source nodes of M3 and M5. The sizes of transistors M1, M3 and M5 can be scaled up as multiples of that of transistors M2, M4 and M6, respectively to deliver a (known) desired current level. Note that the source of M3 pulls up much faster than the source of M5 due to the lower impedance provided by M1 to the power supply than that of M3. The cascode arrangement allows a softer turn-on of currents and isolates transients from reaching the output. Both M3 and M5's gate voltages are capacitively filtered to absorb the parasitic coupling by the large source voltage variations during turn-on and turn-off. Transmission switch S1 is turned on to lower the source voltage of M5 thus enabling M5's fast turn-off while M1 is turned off via the CMOS differential buffer circuit. Vbias is a voltage that is connected to M5's source at turn-off through transmission switch, S1. For complete turn-off of M5, Vbias when connected in the off-state must be a voltage that leaves M5's gate-to-source voltage at less than one threshold. Those skilled in the present state of the art will recognize that the invention does not limit to the transmission switch circuit represented here. The transmission switch can be designed with many other methods for this invention.

Figure 5:
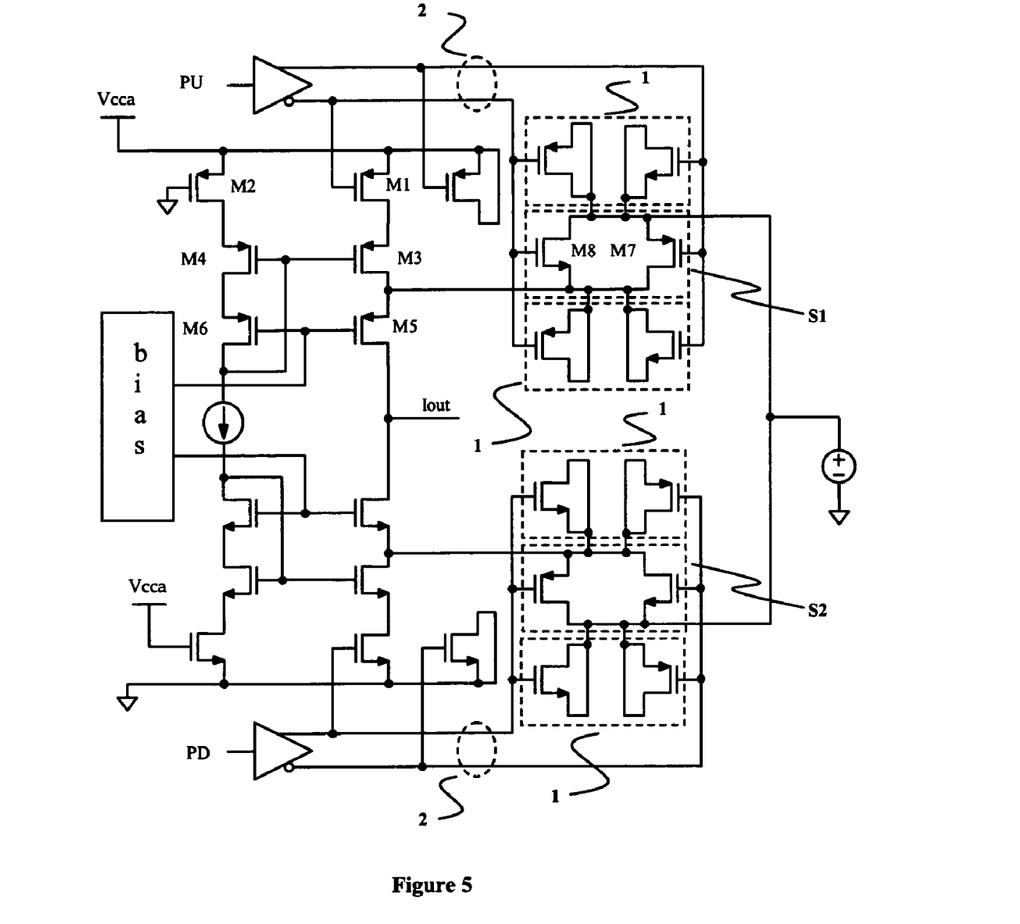
FIG. 5 is a schematic of the symmetric charge pump constructed with the principles of the invention.

FIG. 5 shows the schematic of the symmetric charge pump. Dummy load devices, 1 are used to balance out charge sharing and to equalize the load capacitance on the differential CMOS control lines, 2. Dummy load transistors as shown with the drain and source shorted together are connected together across the transmission switch, S1 and S2. The dummy loading capacitances from the M5/M3' source/drain connection and the control voltage, Vbias, balance out the charge injected across the parasitic capacitance of transmission switch, S1 due to the switching of the CMOS differential control signal pair, PU. In addition, the dummy loading capacitances equalize the capacitive load of the CMOS driving control signals, PU and PD to maintain the symmetry of these signals' rise and fall times as more charge pump stages are added.

Figure 6:
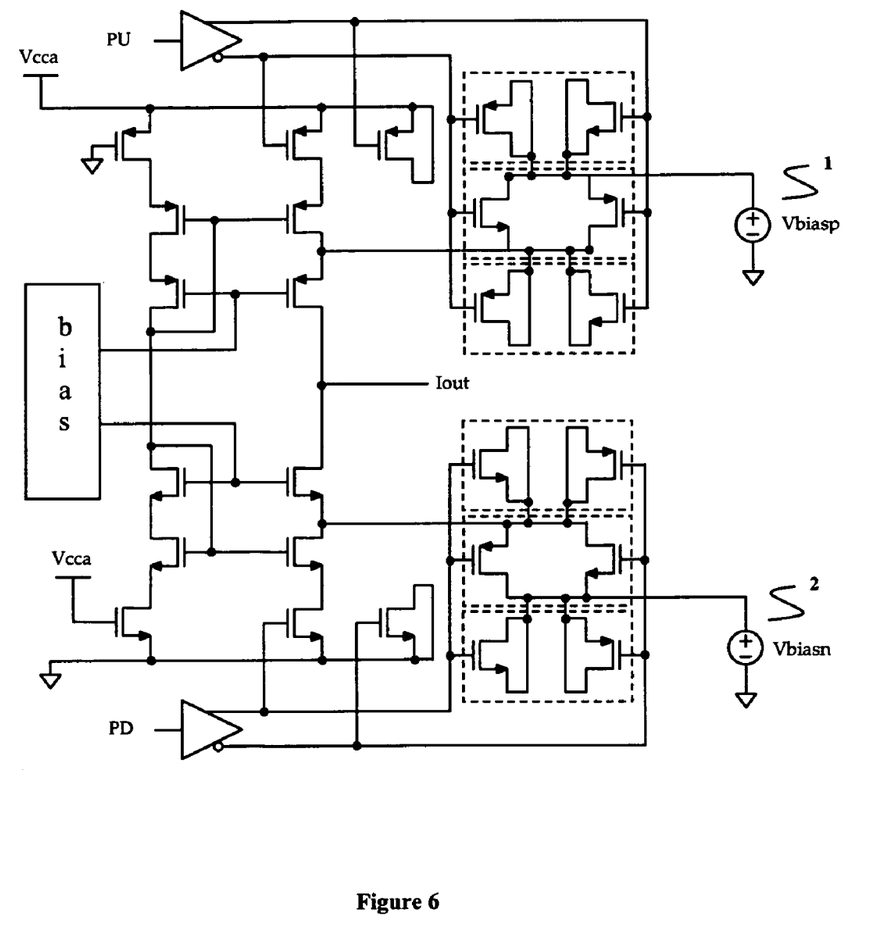
FIG. 6 is a schematic of the symmetric charge pump with two independent reference bias voltage sources constructed with the principles of the invention.

When higher circuit output voltages are needed, the optimum bias voltage for complete output current turn-off diverges from a common reference bias voltage, Vbias, as shown in FIG. 4 for both charge pump up and pump down operations. FIG. 6 shows the schematic of the symmetric charge pump with two independent reference bias voltage sources, Vbiasp, 1 and Vbiasn, 2 for generating high output voltages.

Figure 7:
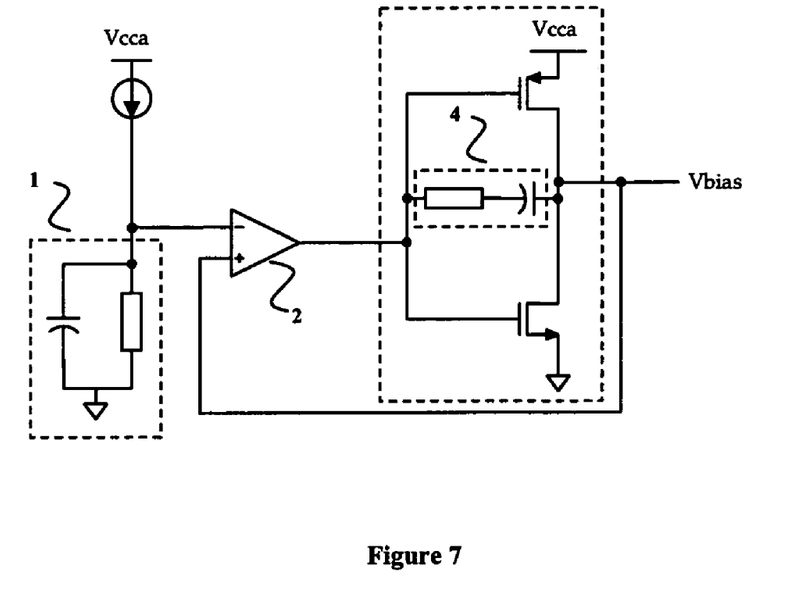
FIG. 7 is a schematic of the charge pump reference bias voltage constructed with the principles of the invention.

FIG. 7 shows the schematic of a Charge Pump source/sink reference bias voltage. A reference voltage with minimal variation over manufacture process is developed by sourcing a current through the proper monolithic resistance. The current varies inversely with resistance to keep the internal reference voltage, 1 at a constant potential. The operational amplifier (OPAMP), 2 and the additional output stage, 3 form a two-stage amplifier that keeps the output impedance at node Vbias low such that the circuit acts as a good voltage source. The network, 4 between the first and second stage performs frequency compensation to guarantee stability. Those skilled in the present state of the art will recognize that the invention does not limit to the bias circuit, OPAMP, additional output stage and the frequency compensation network as represented here. These blocks can be designed by many other methods for this invention.

Figure 8:
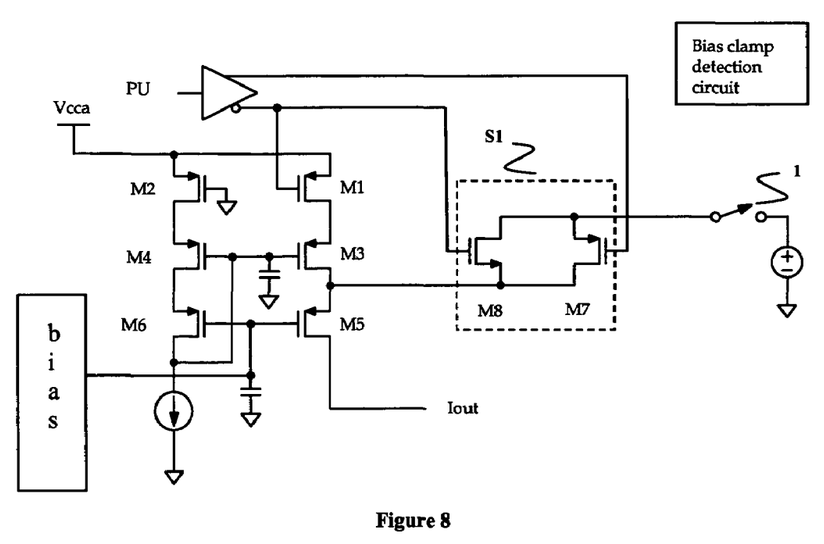
FIG. 8 is a schematic of the charge pump with a replica bias clamp detection circuit constructed with the principles of the invention.

FIG. 8 shows an extension of the original charge pump design as shown in FIGS. 4, 5 and 6 by adding a replica bias clamp detection circuit which limits the reverse leakage current in the off-state. The function of the replica bias clamp circuit is to detect leakage current in a replica charge pump circuit and to open the switch, 1, to disable the transmission switch S1 in the charge pump from connecting to the voltage reference node, Vbias. This circuit monitors leakage current on both the top side and bottom side current source and sink drivers, respectively.

Figure 9:
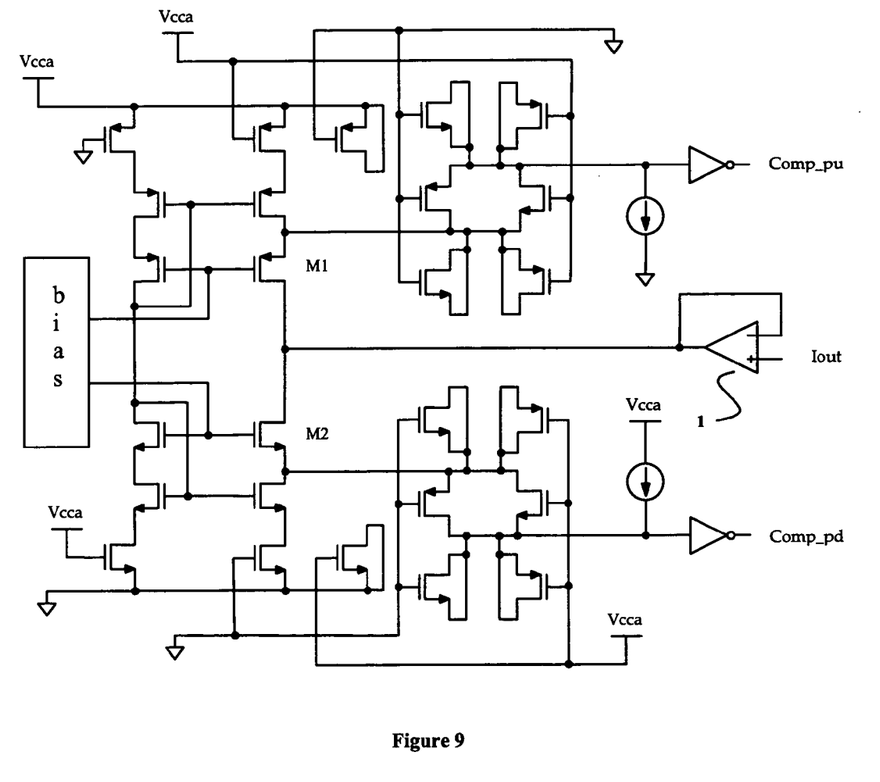
FIG. 9 is a schematic of the replica bias clamp detection circuit constructed with the principles of the invention.

FIG. 9 shows the full replica bias clamp detection circuit.

The replica bias clamp is a replica of the identical charge pump in the switched off state. The replica bias clamp circuit monitors the reverse leakage current effect due to high or low loop filter voltages that are seen on the output of the charge pump, Iout. In the preferred embodiment of this invention, it is preferable to buffer the charge pump/loop filter voltage back to the replica section with a unity gain voltage follower, 1. The leakage current mechanism is due to the fact that the output cascode transistors M1 or M2 may become turned on in the reverse direction. The reverse current mechanism is due to the fact that M1 and M2's gate voltages are biased independently at fixed values. Thus, during the off-state time with the transmission switch shorted to the reference voltage, Vbiasp/Vbiasn, a large leakage current may flow. For example, if the node voltage at Iout is one threshold voltage above M1's gate, M1 will turn on in the reverse direction. Because this section is a replica circuit that tracks the actual charge pump transistor, a reverse current would flow into the charge pump source output into the reverse direction. This condition has the possibility to occur during circuit power up and PLL lockup transient conditions. Thus for occasions where the loop filter voltage can exceed the output voltage compliance of the charge pump, this replica clamp circuit is very important.

Figure 10:
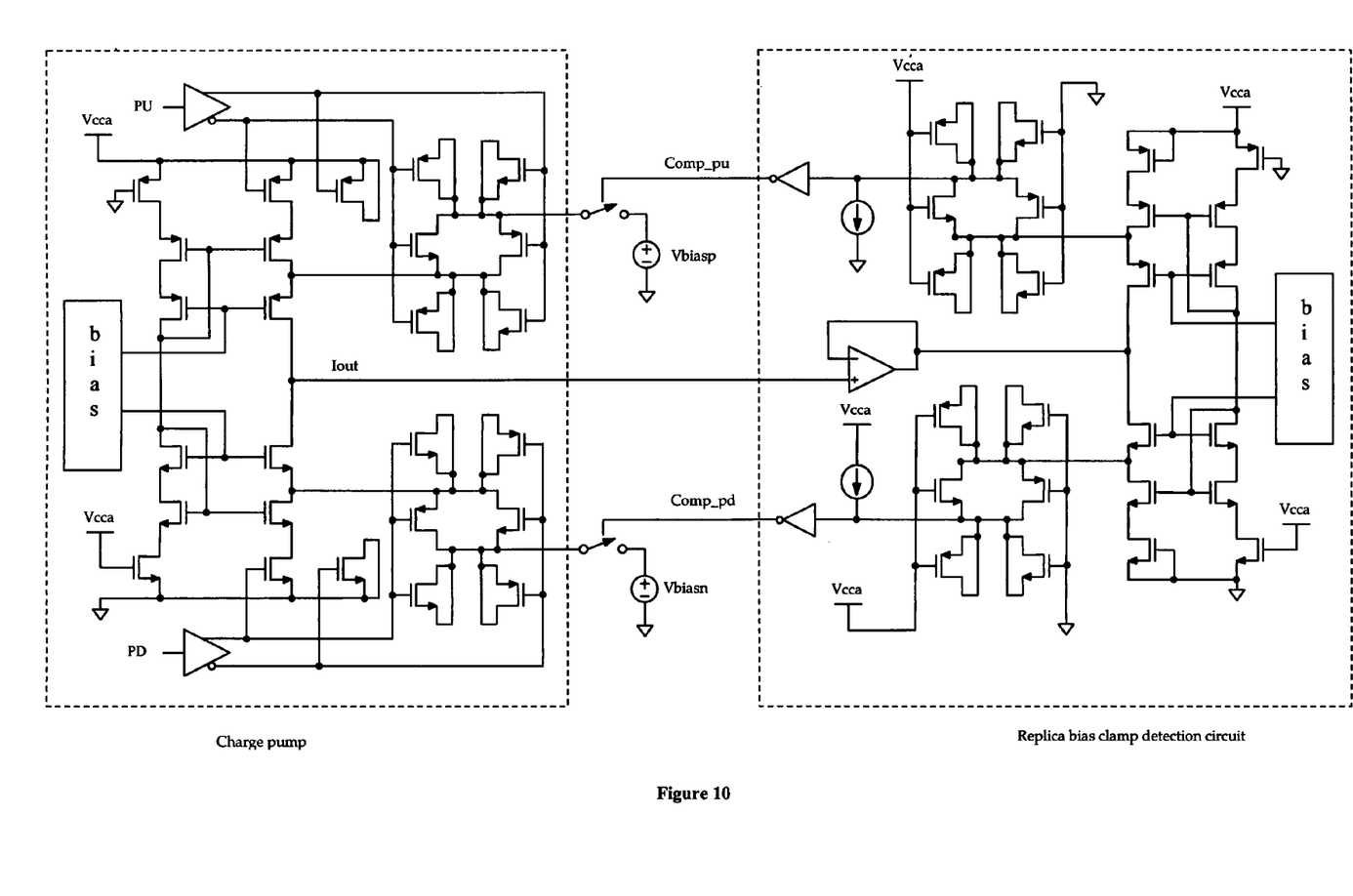
FIG. 10 is a schematic of the charge pump circuit with the replica bias clamp detection circuit constructed with the principles of the invention.

FIG. 10 shows the schematic of the charge pump circuit with the replica bias clamp detection circuit as described in FIGS. 8 and 9.

Figure 11:
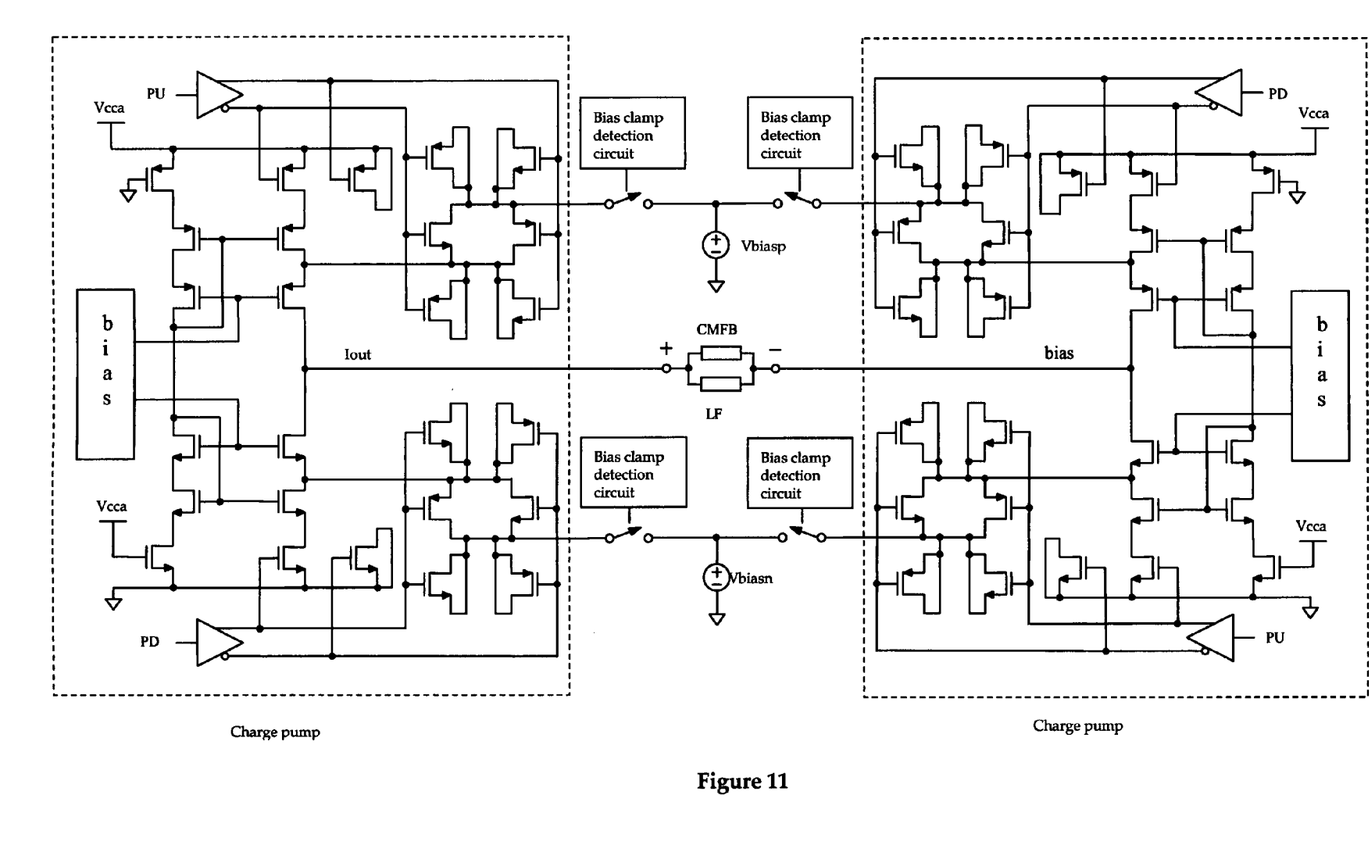
FIG. 11 is a schematic of the differential charge pump circuit with the replica bias clamp detection circuits constructed with the principles of the invention.

FIG. 11 shows the schematic of a differential charge pump with their respective replica bias clamp detection circuits. The differential charge pump is an extension of the single-ended design as described in FIGS. 5, 8 and 9. The differential charge pump sections drive the same passive loop filter, LF which is in parallel with a common mode feedback circuit, CMFB, to maintain the "common mode" voltage across the LF load. The LF load has two nodes with opposite polarities at all times. Common mode feedback circuitry is widely used in electrical design and the block shown can represent many different design approaches. To charge the LF in the positive direction, a current is sourced from the left charge pump into the LF positive node and a current is sunk into the right charge pump from the negative node of the LF voltage in the negative direction requires the currents to flow in the reverse directions.

The invention claimed is:

1. A charge pump having improved symmetry that limits the reference frequency feed-though of clocking signals generated from a phase frequency detector comprising:
   a differential buffer responsive to the clocking signals and providing a first output and a second output;
   a pull-up current source responsive to the first output and providing a pull-up current; and
   a transmission switch responsive to the first and second outputs for increasing turn off speed of said pull-up current source, wherein the transmission switch includes
   a complementary transmission gate coupled to the pull-up current source and a bias supply coupled between the complementary transmission gate and ground.

2. The charge pump of claim 1 further comprising:
   a second differential buffer responsive to the clocking signals and providing a third output and a fourth output;
   a pull-down current sink responsive to the third output and providing a pull-down current; and
   a second transmission switch responsive to the third and fourth outputs for increasing turn off speed of said pull-down current sink.

3. The charge pump of claim 2, wherein the second transmission switch includes
   a second complementary transmission gate coupled to the pull-down current sink and to the bias supply.

4. The charge pump of claim 2, wherein the second transmission switch includes
   a second complementary transmission gate coupled to the pull-down current sink and a second bias supply coupled between the second complementary transmission gate and ground.

5. The charge pump of claim 2, further including
   a CMOS dummy load network to equalize the loading capacitance of the complementary transmission gate.

6. The charge pump of claim 3, further including
   a CMOS dummy load network to equalize the loading capacitance of the second complementary transmission gate.

7. The charge pump of claim 3, further including
   a first CMOS dummy load network to equalize the loading capacitance of the complementary transmission gate; and
   a second CMOS dummy load network to equalize the loading capacitance of the second complementary transmission gate.

8. The charge pump of claim 4, further including
   a CMOS dummy load network to equalize the loading capacitance of the second complementary transmission gate.

9. The charge pump of claim 4, further including
   a first CMOS dummy load network to equalize the loading capacitance of the complementary transmission gate; and
   a second CMOS dummy load network to equalize the loading capacitance of the second complementary transmission gate.

10. A method of charge pumping having improved symmetry that limits the reference frequency feed-though of clocking signals generated from a phase frequency detector comprising:
    differentially buffering the clocking signals to provide a first output and a second output;

providing a pull-up current, with a pull-up current source, responsive to the first output; and increasing turn off speed of said pull-up current source using a transmission switch responsive to the first and second outputs, wherein the transmission switch includes a complementary transmission gate coupled to the pull-up current source and a bias supply coupled between the complementary transmission gate and ground.

11. The method of claim 10 further comprising:

differentially buffering the clocking signals to provide a third output and a fourth output;

providing a pull-down current, with a pull-down current sink, responsive to the third output and providing a pull-down current; and increasing turn off speed of said pull-down current sink using a second transmission switch responsive to the third and fourth outputs.

12. The method of claim 11, wherein the second transmission switch includes a second complementary transmission gate coupled to the pull-down current sink and to the bias supply.

13. The method of claim 11, wherein the second transmission switch includes a second complementary transmission gate coupled to the pull-down current sink and a second bias supply coupled between the second complementary transmission gate and ground.

14. The method of claim 11, further including equalizing the loading capacitance of the complementary transmission gate with a CMOS dummy load network.

15. The method of claim 12, further including equalizing the loading capacitance of the second complementary transmission gate with a CMOS dummy load network.

16. The method of claim 12, further including equalizing the loading capacitance of the complementary transmission gate with a first CMOS dummy load network; and equalizing the loading capacitance of the second complementary transmission gate with a second CMOS dummy load network.

17. The method of claim 13, further including equalizing the loading capacitance of the second complementary transmission gate with a CMOS dummy load network.

18. The method of claim 13, further including equalizing the loading capacitance of the complementary transmission gate with a first CMOS dummy load network; and equalizing the loading capacitance of the second complementary transmission gate with a second CMOS dummy load network.

* * * * *